(12) United States Patent
Qiu et al.

(10) Patent No.: US 9,049,796 B2
(45) Date of Patent: Jun. 2, 2015

(54) CLIENT CONNECTION DEVICE FOR UPS SYSTEM

(75) Inventors: Hongjie Qiu, Shenzhen (CN); Ping Gong, Shenzhen (CN)

(73) Assignee: LIEBERT CORPORATION, Columbus, OH (US)

( * ) Notice: Subject to any disclaimer, the term of this patent is extended or adjusted under 35 U.S.C. 154(b) by 466 days.

(21) Appl. No.: 13/415,301

(22) Filed: Mar. 8, 2012

(65) Prior Publication Data

US 2012/0250236 A1 Oct. 4, 2012

(30) Foreign Application Priority Data

Mar. 29, 2011 (CN) ........................ 2011 2 0086974 U

(51) Int. Cl.
*H02B 1/26* (2006.01)
*H05K 7/14* (2006.01)

(52) U.S. Cl.
CPC ................................... *H05K 7/1457* (2013.01)

(58) Field of Classification Search
USPC ......... 361/614, 621–622, 625, 627–631, 633, 361/636–637, 640–648, 652, 656, 673, 752, 361/796, 829–832
See application file for complete search history.

(56) References Cited

U.S. PATENT DOCUMENTS

| | | | | |
|---|---|---|---|---|
| 5,982,652 A * | 11/1999 | Simonelli et al. | ............. | 363/142 |
| 6,442,017 B1 * | 8/2002 | Ewing et al. | ................. | 361/628 |
| 7,271,506 B1 * | 9/2007 | Bersiek | ......................... | 307/125 |
| 8,570,714 B2 * | 10/2013 | Weighell et al. | ............. | 361/621 |
| 8,610,316 B2 * | 12/2013 | Spitaels et al. | ................ | 307/147 |
| 8,659,881 B2 * | 2/2014 | Tsai et al. | ..................... | 361/637 |
| 2010/0275441 A1 * | 11/2010 | Rasmussen et al. | ........... | 29/857 |

* cited by examiner

*Primary Examiner* — Courtney Smith
(74) *Attorney, Agent, or Firm* — Harness, Dickey & Pierce, P.L.C.

(57) ABSTRACT

A client connection device for a UPS system includes a frame on which a main input distribution unit, a bypass input distribution unit, a battery distribution unit, and an output distribution unit are provided, in which the main input distribution unit and the bypass input distribution unit are arranged on the frame with being opposite to each other up and down, the output distribution unit and the battery distribution unit are arranged on the frame on different sides of the main input distribution unit and the bypass input distribution unit, and the battery distribution unit is side placed near the main input distribution unit and the bypass input distribution unit. A client connection device for a UPS system is provided which can be of a compact structure, be space saving, and be convenient for space operation.

19 Claims, 5 Drawing Sheets

CLIENT CONNECTION DEVICE FOR UPS SYSTEM

FIELD

The present utility model relates to auxiliary equipment for a UPS (Uninterruptible Power Supply) system, and in particular, to a client connection device for the UPS system.

BACKGROUND

The client connection device for the UPS system is used in a high-power UPS with high power density, and mainly includes a battery distribution unit, a main input distribution unit, a bypass input distribution unit, and an output distribution unit. In the prior art, the respective units as mentioned above are arranged side by side. That is, the battery distribution unit, the main input distribution unit, the bypass input distribution unit, and the output distribution unit are lined up, in which a battery input EMI (ElectroMagnetic Interference) board and battery input copper bars in the battery distribution unit are disposed vertically on the right side. Such arrangement causes the device to occupy a relative large space in a cabinet, especially a relative large transverse space in the cabinet. Thus, the whole volume of the cabinet is relative large and the transverse width thereof is relative wide, which is inconvenient for the arrangement and installation of the device.

SUMMARY

In light of the defect in the prior art that a relative large space in the cabinet is occupied due to the lined up arrangement, an object of the present utility model is to provide a client connection device for a UPS system which can be of a compact structure, be space saving, and be convenient for space operation.

To achieve the above object, according to an aspect of the present utility model, there is provided a client connection device for a UPS system including a frame on which a main input distribution unit, a bypass input distribution unit, a battery distribution unit, and an output distribution unit are provided, in which the main input distribution unit and the bypass input distribution unit are arranged on the frame with being opposite to each other up and down, the output distribution unit and the battery distribution unit are arranged on the frame on different sides of the main input distribution unit and the bypass input distribution unit, and the battery distribution unit is side placed near the main input distribution unit and the bypass input distribution unit.

The output distribution unit is provided on the frame on the left side of the main input distribution unit and the bypass input distribution unit, and arranged correspondingly side by side with the main input distribution unit and the bypass input distribution unit, and the battery distribution unit is side placed on the frame on the right side of the main input distribution unit and the bypass input distribution unit.

The main input distribution unit is arranged above the bypass input distribution unit.

The main input distribution unit includes a main input EMI board and main input copper bars, the main input EMI board being provided horizontally, and the main input copper bars being L-shaped bent copper bars in which portions of the L-shaped bent copper bars are provided horizontally and are fixedly connected with the main input EMI board, and the other portions of the L-shaped bent copper bars are provided vertically on the side of the main input EMI board and are electrically connected with the bypass input distribution unit.

The bypass input distribution unit includes a bypass input EMI board provided vertically and bypass input copper bars, the bypass input copper bars being electrically connected with the main input distribution unit.

The output distribution unit includes an output EMI board provided vertically and output copper bars fixedly connected with the output EMI board, the output copper bars further being connected with a switch.

The output distribution unit further includes three CTs (Current Transformers) stacked triangularly, and the output copper bars are arranged side by side, pass through the three CTs, respectively, and assembled on the frame with the output EMI board.

The battery distribution unit includes a battery input EMI board arranged vertically with the main input distribution unit and the bypass input distribution unit and battery input copper bars connected with the battery input EMI board.

The battery input copper bars are close to the side of the main input distribution unit and the bypass input distribution unit and are fixed on the frame, and the battery input EMI board is fixed on the rear of the battery input copper bars.

According to the present utility model, the main input distribution unit and the bypass input distribution unit are arranged with being opposite to each other up and down. Thus, it is convenient for short connection when the main and bypass are of the same source, and the transverse space is saved. Further, by arranging the battery distribution unit and the output distribution unit on different sides of the main input distribution unit and the bypass input distribution unit, and by side placing the battery distribution unit near the main input distribution unit and the bypass input distribution unit, the transverse space is further saved. Such arrangement is compact, an installation space of the input and output distribution units, a client operation space, and a suitable wiring space can be guaranteed, and the transverse size of the client connection device can be reduced. The occupied transverse space of the client connection device in the whole equipment is reduced, thereby reducing the width size of the whole equipment.

BRIEF DESCRIPTION OF DRAWINGS

The present utility model will be further described in conjunction with the attached drawings and the embodiments below. In the drawings.

DESCRIPTION OF EMBODIMENTS

Figure 1:
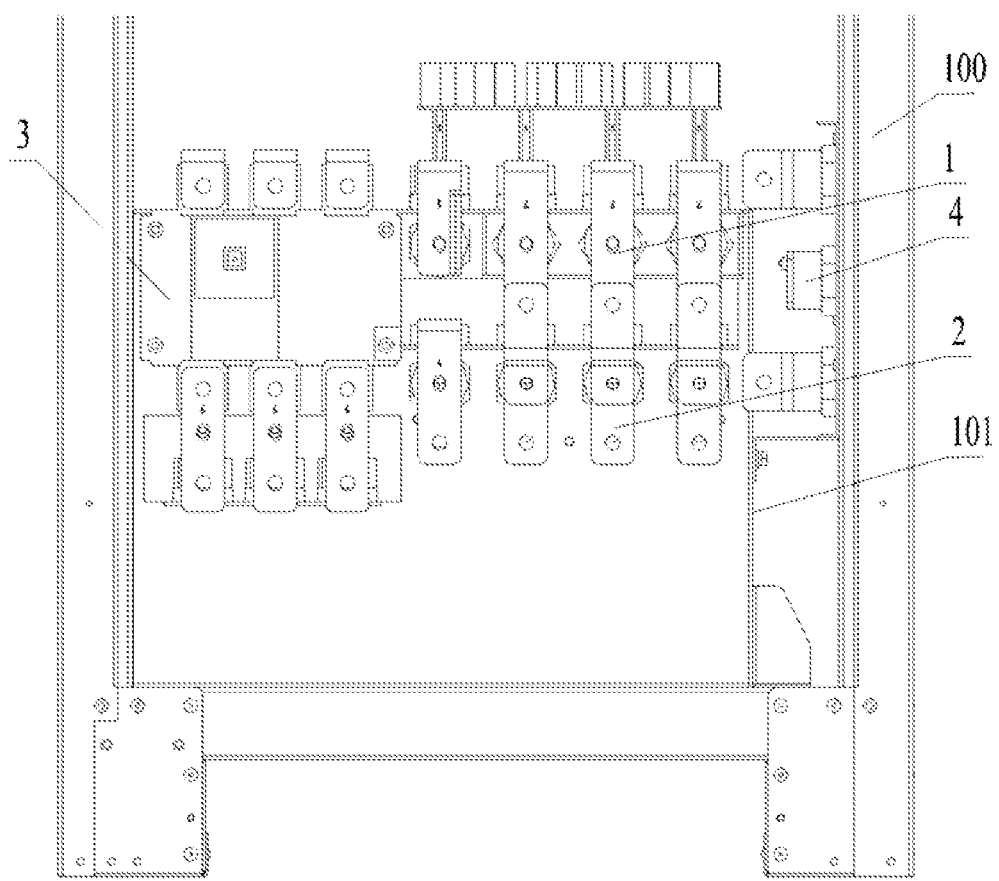
FIG. 1 is a front structural diagram illustrating a client connection device for a UPS system provided within a cabinet according to an embodiment of the present utility model.
Figure 2:
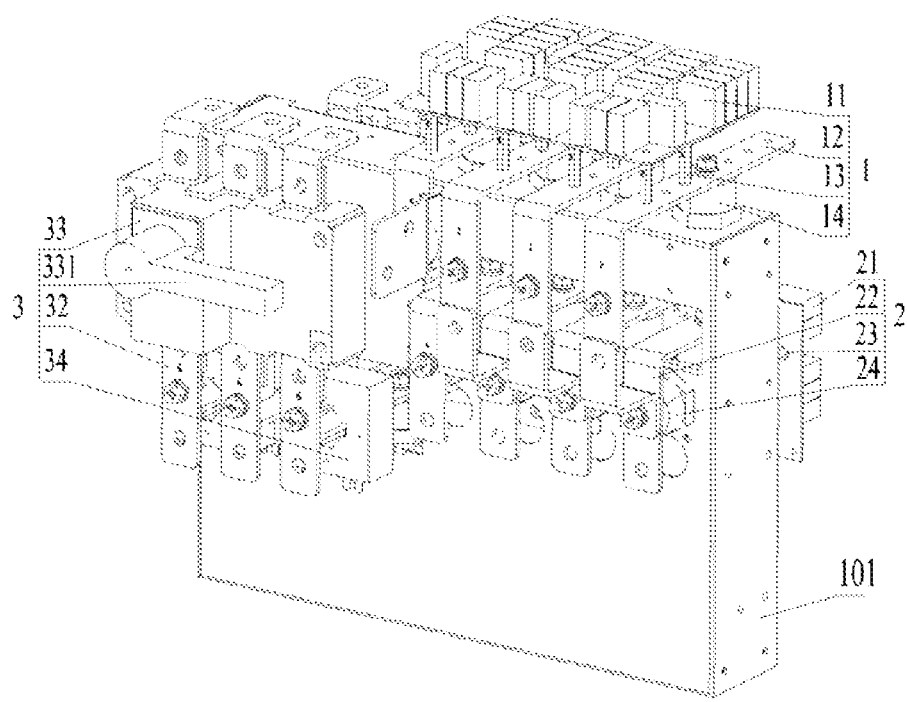
FIG. 2 is a perspective diagram illustrating the client connection device for the UPS system without a battery distribution unit according to the embodiment of the present utility model.
Figure 3:
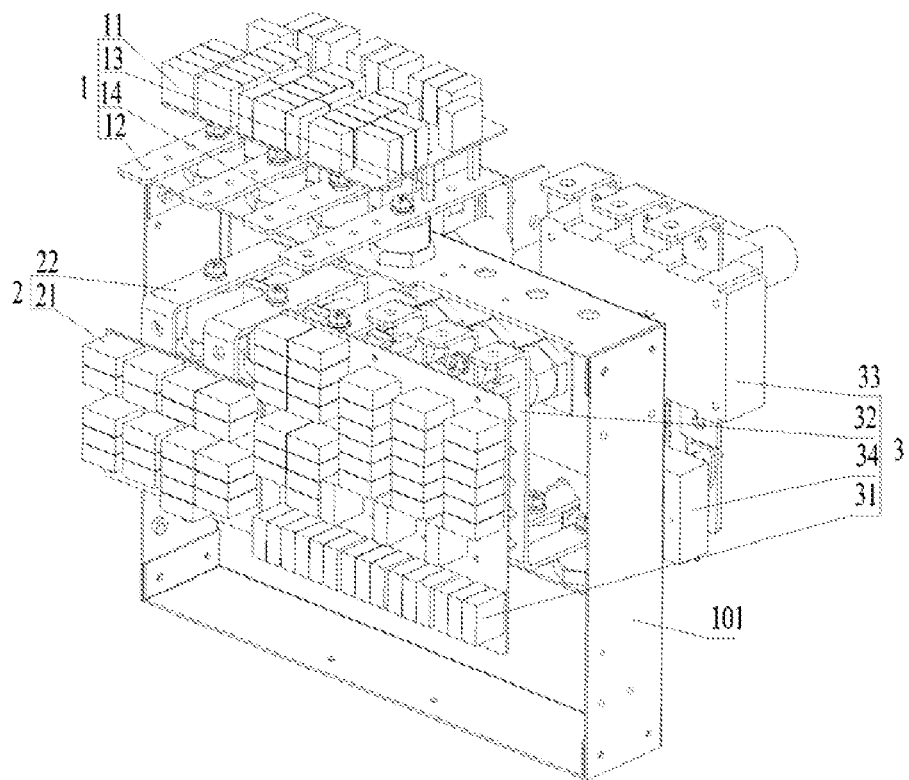
FIG. 3 is another perspective diagram illustrating the client connection device for the UPS system without the battery distribution unit according to the embodiment of the present utility model.
Figure 4:
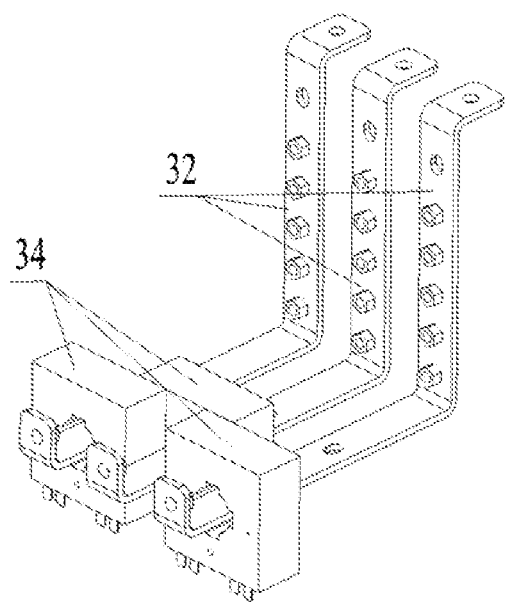
FIG. 4 is a diagram illustrating assembly of CTs with copper bars in an output distribution unit in the client connection device for the UPS system according to the embodiment of the present utility model.

As shown in FIGS. 1, 2 and 3, a client connection device for a UPS system is fixed within a cabinet. The device includes a frame 101 on which a main input distribution unit 1, a bypass input distribution unit 2, a battery distribution unit 4, and an output distribution unit 3 are provided. The main input distribution unit 1 and the bypass input distribution unit 2 are arranged on the frame 101 with being opposite to each other up and down. The up and down position relation between the main input distribution unit 1 and the bypass input distribution unit 2 can be adjusted if necessary. Any of the main input distribution unit 1 and the bypass input distribution unit 2 may be on the upper. In the present embodiment, the main input distribution unit 1 is arranged above the bypass input distribution unit 2. The output distribution unit 3 and the battery distribution unit 4 are arranged on the frame 101 on different sides of the main input distribution unit 1 and the bypass input distribution unit 2, and the battery distribution unit 4 is side placed near the main input distribution unit 1 and the bypass input distribution unit 2.

As shown in FIGS. 1, 2 and 3, the main input distribution unit 1 includes a main input EMI board 11 and main input copper bars 12. The main input EMI board 11 is provided horizontally. The main input copper bars 12 are L-shaped bent copper bars. The main input copper bars 12 are fixed on the frame 101 through insulation connecting pillars 14. One of two bent portions of the main input copper bars 12 is provided horizontally and is fixedly connected with the main input EMI board 11 through a stud 13, and the other is provided vertically and downwardly on the side of the main input EMI board 11 and is electrically connected with the bypass input distribution unit 2. The bypass input distribution unit 2 includes a bypass input EMI board 21 provided vertically and bypass input copper bars 22. The bypass input EMI board 21 is provided on the side of the frame 101 and is fixed on the frame 101 through insulation connecting pillars 24. The bypass input copper bars 22 are also L-shaped bent copper bars. Portions of the bypass input copper bars 22 are fixedly connected with the bypass input EMI board 21 through studs 23, and the other portions of the bypass input copper bars 22 extend to the other side of the frame 101 and are electrically connected with the main input distribution unit 1. Connection of the main input distribution unit 1 with the bypass input distribution unit 2 is realized by connecting the main input copper bars 12 with the bypass input copper bars 22. Connecting parts for client connection on the main input copper bars 12 and the bypass input copper bars 22 are on the side of the frame 101 opposite to the bypass input EMI board 21.

As shown in FIGS. 1, 2, 3 and 4, according to practical mount and operation requirements, it is preferable to provide the output distribution unit 3 on the frame 101 on the left side of the main input distribution unit 1 and the bypass input distribution unit 2. The output distribution unit 3 is provided with a switch 33, and a switch handle 331 is rotatablely operated on the right side by a right hand on most occasions. Therefore, the output distribution unit 3 is provided on the most left side, to provide adequate operation space, ensure security, and prevent hands from being hurt in operation. And for the purpose of a compact layout, the output distribution unit 3 is arranged correspondingly side by side with the main input distribution unit 1 and the bypass input distribution unit 2, so that the output distribution unit 3 occupies a relative small space in the vertical direction. The output distribution unit 3 includes an output EMI board 31 provided vertically and output copper bars 32 fixedly connected with the output EMI board 31. The output EMI board 31 is provided on the side of the frame 101, and the output copper bars 32 are connected with the switch. The output distribution unit 3 further includes three CTs 34 stacked triangularly, and the output copper bars 32 are arranged side by side, pass through the three CTs 34, respectively, and assembled on the frame 101 with the output EMI board 31.

Figure 5:
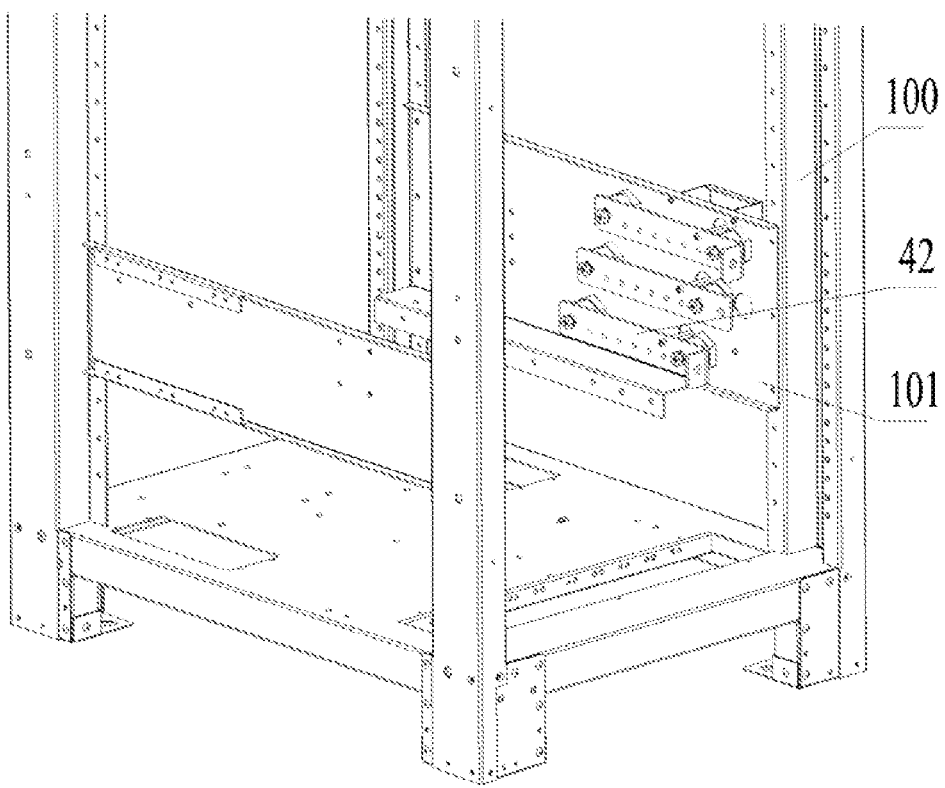
FIG. 5 is a diagram illustrating assembly of the battery distribution unit in the client connection device for the UPS system within the cabinet according to the embodiment of the present utility model.
Figure 6:
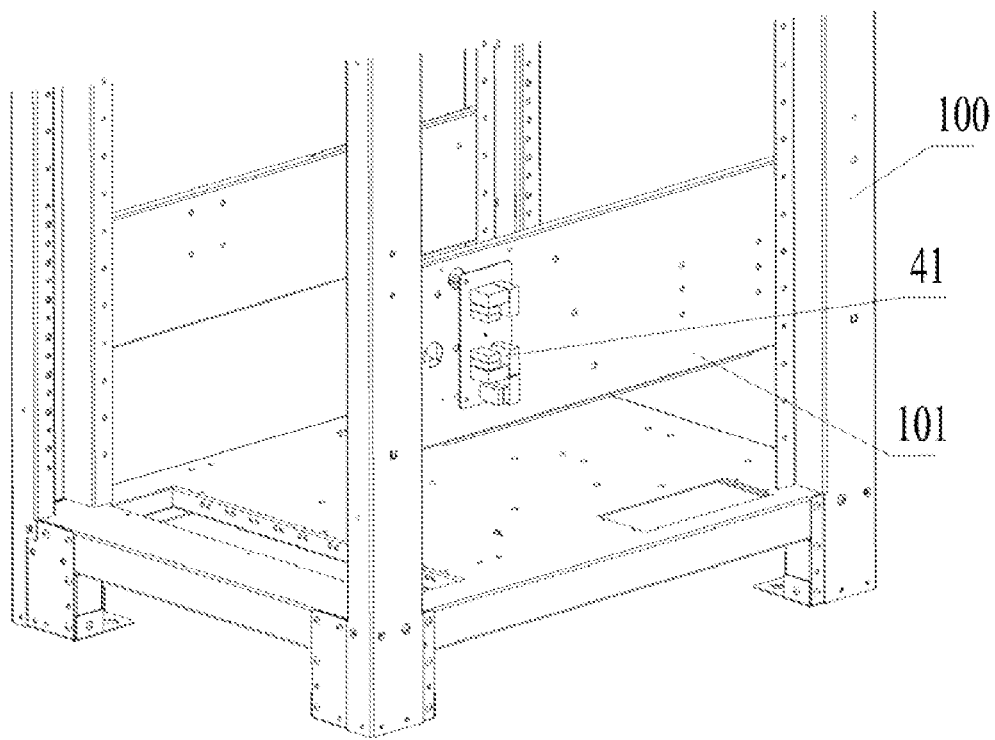
FIG. 6 is another diagram illustrating assembly of the battery distribution unit in the client connection device for the UPS system within the cabinet according to the embodiment of the present utility model.

As shown in FIGS. 1, 5 and 6, since the whole thickness of the battery distribution unit 4 is relatively small, the battery distribution unit 4 is side placed on the frame 101 on the right side of the main input distribution unit 1 and the bypass input distribution unit 2, so as to reduce the traverse space of the battery distribution unit 4 occupied on the frame 101. The battery distribution unit 4 includes a battery input EMI board 41 arranged vertically with the main input distribution unit 1 and the bypass input distribution unit 2 and battery input copper bars 42 connected with the battery input EMI board 41. The battery input copper bars 42 are close to the side of the main input distribution unit 1 and the bypass input distribution unit 2 and are fixed on the frame 101, and the battery input EMI board 41 is fixed on the rear of the battery input copper bars 42. The battery input EMI board 41 is directly connected to the back face of the battery input copper bars 42, ensuring the EMC filtering effect.

What is claimed is:

1. A client connection device for a UPS system comprising a frame on which a main input distribution unit, a bypass input distribution unit, a battery distribution unit, and an output distribution unit are provided, characterized in that the main input distribution unit and the bypass input distribution unit are arranged on the frame with being opposite to each other up and down, the output distribution unit and the battery distribution unit are arranged on the frame on different sides of the main input distribution unit and the bypass input distribution unit, and the battery distribution unit is side placed near the main input distribution unit and the bypass input distribution unit, wherein the output distribution unit is provided on the frame on the left side of the main input distribution unit and the bypass input distribution unit, and arranged correspondingly side by side with the main input distribution unit and the bypass input distribution unit, and the battery distribution unit is side placed on the frame on the right side of the main input distribution unit and the bypass input distribution unit.

2. The client connection device for a UPS system according to claim 1, characterized in that the main input distribution unit is arranged above the bypass input distribution unit.

3. The client connection device for a UPS system according to claim 1, characterized in that the main input distribution unit includes a main input EMI board and main input copper bars, the main input EMI board being provided horizontally, and the main input copper bars being L-shaped bent copper bars in which portions of the L-shaped bent copper bars are provided horizontally and are fixedly connected with the main input EMI board, and the other portions of the L-shaped bent copper bars are provided vertically on the side of the main input EMI board and are electrically connected with the bypass input distribution unit.

4. The client connection device for a UPS system according to claim 1, characterized in that the main input distribution unit includes a main input EMI board and main input copper bars, the main input EMI board being provided horizontally, and the main input copper bars being L-shaped bent copper bars in which portions of the L-shaped bent copper bars are provided horizontally and are fixedly connected with the main input EMI board, and the other portions of the L-shaped bent copper bars are provided vertically on the side of the main input EMI board and are electrically connected with the bypass input distribution unit.

5. The client connection device for a UPS system according to claim 2, characterized in that the main input distribution unit includes a main input EMI board and main input copper bars, the main input EMI board being provided horizontally, and the main input copper bars being L-shaped bent copper bars in which portions of the L-shaped bent copper bars are provided horizontally and are fixedly connected with the main input EMI board, and the other portions of the L-shaped bent copper bars are provided vertically on the side of the main input EMI board and are electrically connected with the bypass input distribution unit.

6. The client connection device for a UPS system according to claim 1, characterized in that the bypass input distribution unit includes a bypass input EMI board provided vertically and bypass input copper bars, the bypass input copper bars being electrically connected with the main input distribution unit.

7. The client connection device for a UPS system according to claim 1, characterized in that the bypass input distribution unit includes a bypass input EMI board provided vertically and bypass input copper bars, the bypass input copper bars being electrically connected with the main input distribution unit.

8. The client connection device for a UPS system according to claim 2, characterized in that the bypass input distribution unit includes a bypass input EMI board provided vertically and bypass input copper bars, the bypass input copper bars being electrically connected with the main input distribution unit.

9. The client connection device for a UPS system according to claim 1, characterized in that the output distribution unit includes an output EMI board provided vertically and output copper bars fixedly connected with the output EMI board, the output copper bars further being connected with a switch.

10. The client connection device for a UPS system according to claim 1, characterized in that the output distribution unit includes an output EMI board provided vertically and output copper bars fixedly connected with the output EMI board, the output copper bars further being connected with a switch.

11. The client connection device for a UPS system according to claim 2, characterized in that the output distribution unit includes an output EMI board provided vertically and output copper bars fixedly connected with the output EMI board, the output copper bars further being connected with a switch.

12. The client connection device for a UPS system according to claim 9, characterized in that the output distribution unit further includes three CTs stacked triangularly, and the output copper bars are arranged side by side, pass through the three CTs, respectively, and assembled on the frame with the output EMI board.

13. The client connection device for a UPS system according to claim 10, characterized in that the output distribution unit further includes three CTs stacked triangularly, and the output copper bars are arranged side by side, pass through the three CTs, respectively, and assembled on the frame with the output EMI board.

14. The client connection device for a UPS system according to claim 11, characterized in that the output distribution unit further includes three CTs stacked triangularly, and the output copper bars are arranged side by side, pass through the three CTs, respectively, and assembled on the frame with the output EMI board.

15. The client connection device for a UPS system according to claim 1, characterized in that the battery distribution unit includes a battery input EMI board arranged vertically with the main input distribution unit and the bypass input distribution unit and battery input copper bars connected with the battery input EMI board.

16. The client connection device for a UPS system according to claim 1, characterized in that the battery distribution unit includes a battery input EMI board arranged vertically with the main input distribution unit and the bypass input distribution unit and battery input copper bars connected with the battery input EMI board.

17. The client connection device for a UPS system according to claim 2, characterized in that the battery distribution unit includes a battery input EMI board arranged vertically with the main input distribution unit and the bypass input distribution unit and battery input copper bars connected with the battery input EMI board.

18. The client connection device for a UPS system according to claim 15, characterized in that the battery input copper bars are close to the side of the main input distribution unit and the bypass input distribution unit and are fixed on the frame, and the battery input EMI board is fixed on the rear of the battery input copper bars.

19. The client connection device for a UPS system according to claim 16, characterized in that the battery input copper bars are close to the side of the main input distribution unit and the bypass input distribution unit and are fixed on the frame, and the battery input EMI board is fixed on the rear of the battery input copper bars.

* * * * *